(12) United States Patent
Li

(10) Patent No.: US 6,521,540 B1
(45) Date of Patent: Feb. 18, 2003

(54) METHOD FOR MAKING SELF-ALIGNED CONTACTS TO SOURCE/DRAIN WITHOUT A HARD MASK LAYER

(75) Inventor: Weining Li, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/345,357

(22) Filed: Jul. 1, 1999

(51) Int. Cl.[7] ............................................. H01L 21/302
(52) U.S. Cl. ...................... 438/706; 720/723; 720/724; 720/745; 720/754; 720/755; 720/756; 720/757
(58) Field of Search .................. 438/706, 720, 438/723, 724, 745, 754, 755, 756, 757, 721

(56) References Cited

U.S. PATENT DOCUMENTS

| | | | |
|---|---|---|---|
| 5,480,814 A | 1/1996 | Wuu et al. ..................... | 437/41 |
| 5,605,854 A | * 2/1997 | Yoo ............................. | 437/44 |
| 5,723,893 A | * 3/1998 | Yu et al. ..................... | 257/413 |
| 5,731,241 A | 3/1998 | Jang et al. .................. | 438/424 |
| 5,817,562 A | 10/1998 | Chang et al. ................ | 438/305 |

* cited by examiner

*Primary Examiner*—Benjamin L. Utech
*Assistant Examiner*—Charlotte A. Brown
(74) *Attorney, Agent, or Firm*—George O. Saile; Rosemary L. S. Pike

(57) ABSTRACT

An improved and new process for fabricating self-aligned contacts (SAC) to source/drain areas of complimentary (CMOS) FET's has been developed using a non-conformal layer of silicon nitride, eliminating the need for a hard mask. This process allows for "zero" spacing from contact structure to polysilicon gate structure, for closely spaced design rule gates. Some key process features of this invention are as follows: no hard mask is needed and the gate process is exactly the same as "standard" logic process. The process differences are that between the S/D implant, salication and the normal contact process, there is inserted a non-conformal CVD silicon nitride deposition with a SAC pattern and etch process. The process is fully compatible with both state of-the-art salicide and polycide processes. The self-aligned contact process simplifies processing, while yielding improvements in electrical device performance and reliability. The process is very useful for the "standard" logic device salicided processes.

23 Claims, 2 Drawing Sheets

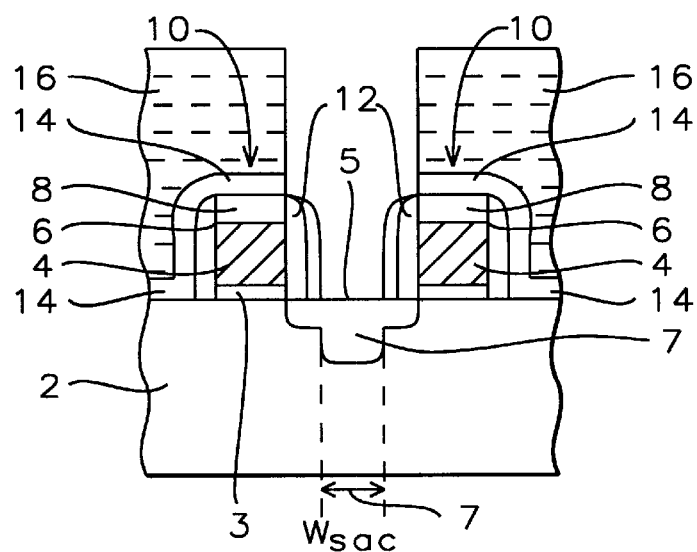
FIG. 1 - Prior Art
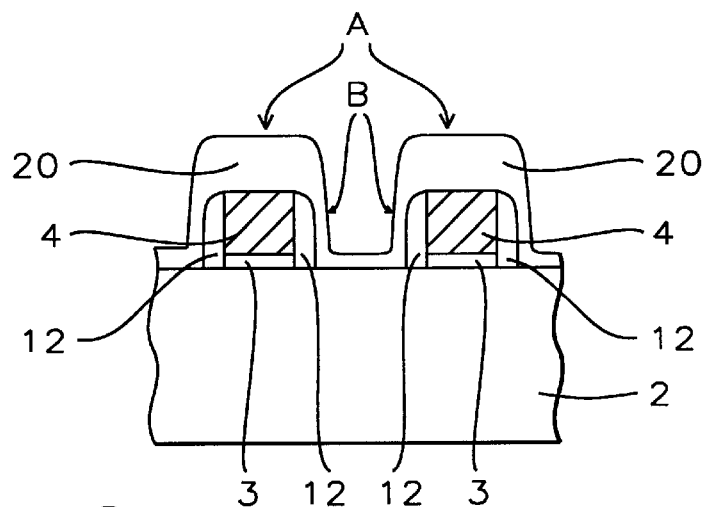
FIG. 2
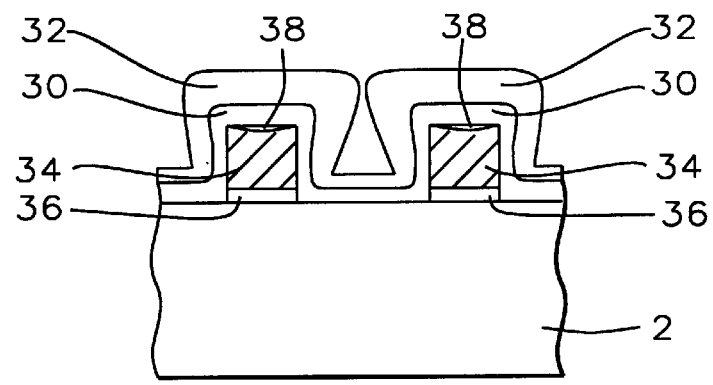
FIG. 3

METHOD FOR MAKING SELF-ALIGNED CONTACTS TO SOURCE/DRAIN WITHOUT A HARD MASK LAYER

BACKGROUND OF THE INVENTION

(1) Field of the Invention

This invention relates to a method of fabrication used for semiconductor integrated circuit devices, and more specifically to the formation self-aligned contacts to source/drain regions, next to polysilicon gate structures, that allows for "zero" spacing from contact structure to gate structure, without requiting the use of an insulating hard mask layer over the poly gate. The process is very useful for the "standard" logic device salicided processes.

As transistor dimensions approached sub-micron, the conventional contact structures start to limit device performance in several ways. First, it becomes difficult to minimize contact resistance when the contact hole opening is of minimum size-and also problems with cleaning small contact holes become a concern. In addition, with defined conventional contacts, the area of the source/drain regions cannot be minimized because the contact hole has be aligned to these regions with a separate masking step, and a large "extra" area has to be allocated for possible misalignment. Furthermore, this larger "extra" area also results in increased source/drain-to-substrate junction capacitance, which impacts device speed. Finally, when conventional width MOSFET's are fabricated with conventional contacts, several small, uniformly sized contact holes have to be used, rather than one wider contact hole. The main reason for this is that being of same size, the contact holes will to be opened simultaneously during the etching process. Using several small, equally sized contact holes rather than one wider one, wastes valuable space and the full width of the source/drain region is not fully utilize. Hence, the conventional device contact resistance is larger than it could have been in a device having minimum width. Self-aligned contact process schemes solve many of the micron and sub-micron CMOS MOSFET contact problems, easing both the device ground rule designs and easing the processing problems associated with convention contacts. The self-aligned contacts makes better use of the space and area over the source/drain region, as will be described in more detail.

In CMOS process technology, metal contacts for the source and drain electrical connection must have some distance or space away from the polysilicon gate to avoid electrically short circuiting the metal contact to the gate electrode. This spacing requirement restricts the product chip density in the design groundless, especially for memory chip technologies. The self-aligned process can be developed to allow "zero" spacing from the contact to source/drain to the gate. The standard or conventional self-aligned contact process utilizes a insulator capped polysilicon for the gate structure. The insulating layer, sometimes referred to as the "hard mask", can either be a conformal layer of silicon nitride or a conformal layer of silicon oxide. This standard SAC, self-aligned contact process works well for the Polycide process (Polycide structure: gate oxide/polysilicon gate/metal silicide) however, this process is not compatible with the Salicide process, self-aligned silicide due to the presence of the insulating layer over the poly gate. Therefore, in order to make the SAC process simple and compatible with the Salicide process, the a SAC process needs to be formulated without the use of the conventional conformal insulating layer over the polysilicon gate structure. As will be shown later in this invention, this invention describes a self-aligned source/drain contact process that allows for "zero" spacing between the source/drain contact to the gate, without requiring the use of an insulator layer on top of the polysilicon gate structure. As will be described later, the process described in this invention is completely compatible with both the state of-the-art current Salicide processing, as well as, the state of-the-art Polycide processing, with improved device electrical performance, improved design groundrules, and improved device reliability.

(2) Description of Related Art

In the fabrication of semiconductor integrated circuits the method of forming SAC, self-aligned contacts to. source/drain regions in the fabrication of CMOS MOSFET's can be used to advantage to improve chip design ground rules, improve contact reliability, and improved device performance. In some cases, these self-aligned process schemes are merged with shallow trench isolation (STI) schemes. This section contains pertinent PRIOR ART patents and are meant to provide some processing background for the present invention.

U.S. Pat. No. 5,731,241 entitled "Self-Aligned Sacrificial oxide for Shallow Trench Isolation" granted Mar. 24, 1998 to Jang et al describes a method of forming a sacrificial self aligned sub-atmospheric chemical vapor deposition (SACVD) ozone-TEOS tetra-ethyl-ortho-silicate layer over a trench oxide. This layer protects the trench oxide and is preferentially deposited over the trench oxide rather than over the thermally grown pad oxide. Two preferred embodiments are presented: (1) a first self aligned sacrificial ozone-TEOS layer over the trench before the pad oxide etch, and (2) a second self-aligned sacrificial ozone-TEOS layer deposited before the sacrificial ion implant oxide etch. The protecting ozone-TEOS film layer can be applied in a variety of process situations in shallow trench isolation (STI), where it protects the trench oxide from etch damage.

U.S. Pat. No. 5,817,562 entitled "Method for Making Improved Polysilicon FET Gate Electrode Structures and Sidewall Spacers for More Reliable Self-Aligned Contacts (SAC)" granted Oct. 6, 1998 to Chang et al shows a method of forming FET stacked gate electrode structures with improved sidewall profiles. The more vertical sidewalls improve the control tolerance of the gate electrode effective length and improve the shape of the sidewall spacers for making more reliable metal contacts to self-aligned source/drain contact areas. The method employs the use of a stacked gate electrode layer having a tetra-ethyl-ortho-silicate (TEOS) oxide and a hard mask of silicon nitride on the gate electrode polysilicon layer. This stacked gate structure is used during patterning and prevents a buildup of polymer on the sidewall. The end result is improved gate line length tolerance, improved gate sidewall spacers, that minimize shorts between metal source/drain contacts and the polysilicon gate electrodes.

U.S. Pat. No. 5,480,814 entitled "Process of Making a Polysilicon Barrier Layer in a Self-Aligned Contact Module" granted Jan. 2, 1996 to Wuu et al shows a method of forming a metal contact in a self aligned contact region over an impurity region in a substrate. A doped polysilicon layer is formed over the device surface except in a contact area. A thin polysilicon barrier layer and a metal layer are then formed over the poly layer and the contact area. The resulting metal contact structures are reported to have superior step coverage, lower resistivity, and maintains the shallow junction depth of buried impurity regions.

The present invention is directed to a novel method of forming self aligned metal electrical contacts to source/drain areas allowing for "zero" spacing between the contact and gate area and a summary of the main embodiments of the present invention follows.

SUMMARY OF THE INVENTION

It is a general object of the present invention to provide a new and improved method of forming an integrated circuit in which the fabrication of self aligned metal contacts to source/drain area is described, in the manufacture of CMOS MOSFET devices. As a background to the present invention, reference is first made to conventional Prior Art methods.

The standard or conventional Prior Art method for fabricating metal self-aligned contact to source/drain area consists of the follow process steps. Provided are the following layers and structures comprising: substrate of single crystal silicon semiconductor, source/drain contact region over source/drain ion implantation/diffusion area, FET gate oxide, gate electrode stack which consists of insulator capped polycide structure (gate oxide, polysilicon gate, and metal silicide). The gate insulator cap material is referred to as the hard mask insulator layer. Gate etch over the gate region is needed to remove this hard mask insulator layer (cap) prior to an etch step which etches into the polycide structure. After a conventional gate sidewall spacer formation process and source/drain ion implantation, another insulator layer, typically silicon nitride, is used to serve as the etch-stop layer for the self aligned contact (SAC) etch process when the cap insulator used is a silicon oxide layer (BPSG, boro phosphosilicate glass). The SAC etch process to contact the source/drain area removes the BPSG and stops either on the etch-stop insulator or on the gate hard mask layer. Then, a second etch step with different chemistry is utilized, in the case where an etch-stop layer is utilized, to remove the etch-stop layer. In this standard or conventional SAC process, an additional gate contact patterning mask is needed to open the contacts to the gate electrode, over the polysilicon gate.

One of the first embodiments of the present invention for fabricating metal self-aligned contact to the source/drain area is described below. For completeness, the following layers are provided comprising: the substrate of single crystal silicon, gate oxide, polysilicon gate with appropriate gate sidewall spacers. Key to this invention is the use of a special chemical vapor deposition (CVD) process that produces a non-conformal layer of silicon nitride over the gate. This special chemical vapor deposition (CVD) process, fabricating the said non-conformal layer of silicon nitride, simplifies this SAC process to source/drain areas and eliminates the need for an etch-stop layer, which was required earlier in the Prior Art conventional processing. As can be analyzed using cross-sectional specimens with SEM microscopy, the non-conforming silicon nitride layer is much thicker over the top of the polysilicon gates, than is said nitride at the bottom and in between the polysilicon gates. This special non-conformal chemical vapor deposition (CVD) silicon nitride layer, as described above, is a key embodiment to this invention, SAC to source/drain method or process.

A more specific object of the present invention is to provide an improved method of forming an integrated circuit in which the self aligned contact source/drain process is simplified and designed to fabricate more reliable devices. Using SEM microscopy to aid in process analysis, the results of special chemical vapor deposition (CVD) conditions for both a silicon dioxide layer and a silicon nitride layer over closely spaces polysilicon gate structures were analyzed. These non-conformal layers (data taken from a current manufacturing CMOS production process) over polysilicon gates, further enhance some of the main elements and embodiments of the present invention. In addition, by this method the use of a hard mask layer on top of the gate is eliminated by using the said non-conformal deposition of chemical vapor deposition of silicon nitride. One of the process problems of depositing a chemical vapor deposition (CVD) layer of film between two closely structures, i.e., polysilicon gates, is known as "bread loafing", a film layer appears to have a cross-sectional profile of a loaf of bread at the top edge and in between poly gates. Too much "bread loafing" can cause the chemical vapor deposition (CVD) process to fail to deposit adequate film between the poly gate structures. Furthermore, the chemical vapor non-conformal deposition processes can produce different thickness between the top and bottom of the dense, closely spaced poly lines. However, a chemical vapor deposition rate ratio of 3:1, between the top and bottom of poly, is achievable by fine tuning.the chemical vapor deposition process.

In one of the key embodiments of the present invention, self aligned contact process to source/drain area, the non-conformal chemical vapor deposition (CVD) of silicon nitride film layer on and in between polysilicon gate structures, has the following properties: non-conformal chemical vapor deposition rate is set at least a 3 to 1 ratio, deposition on top of poly gate being 3× to deposition in between and at the bottom of poly gates being 1×. Therefore, a consist silicon nitride film thickness of 3× is achieved on the top of the poly gates, while a silicon nitride film thickness of 1× is achieved next to and in between gate structures. These stated desirable results have been achieved by this process with a special fine tuning of the non-conformal chemical vapor deposition (CVD) process conditions.

And in yet another key embodiment of the present invention, self aligned contact process to source/drain area, results are presented from an actual state of-the-art CMOS process using the SAC process from this invention. These results are from SEM analysis of the non-conformal deposition processes for: chemical vapor deposition of silicon nitride and silicon dioxide films, respectively. Test results of deposited film thickness (on top poly gates and at the bottom in between poly gates) indicate that favorable thickness ratios between top and bottom of 2:1 for the chemical vapor deposited (CVD) layer of silicon dioxide, and for the chemical vapor deposited (CVD) layer of silicon nitride of 3:1, can be achieved by the process methods of this invention. These thickness ratios achieved are beneficial and desirable for device fabrication for several reasons, that are: ease and simplification of processing, improvement of round rule designs and improvement in device reliability.

And in yet another aspect to the main embodiments of the present invention, self aligned contact process to source/drain area, several key processing features are described in this section for contact to actual device structures. A non-conformal chemical vapor deposition (CVD) silicon nitride is deposited between two parallel polysilicon lines. Through standard conventional processing, several other layers of film are provided, comprising of: gate sidewall spacers, a thick layer of BPSG boro phosphosilicate glass, silicon source/drain region. To open self aligned contacts (SAC) between these two poly lines, a twofold etch process is followed. Firstly, the BPSG boro phosphosilicate glass is removed by etching and the etch step is stopped on chemical vapor deposition (CVD) silicon nitride layer. Note, the selective etch just described must have a high selectivity to etch the silicate glass and not the nitride layer. Secondly, the etch chemistry is changed to remove the remaining silicon nitride on top of the silicon source/drain region by a making use of a time controlled etching process. The key point to note, by using the process method this invention, is that the non-conformal silicon nitride on the top of the poly is much thicker, than the nitride on the surface of silicon (source/drain region) between two parallel poly lines. Hence, the second etch step, described above, can be well controlled to remove just the silicon nitride on the bottom, while safely keeping more than sufficient silicon nitride on top of the poly for isolation purposes. Hence, this process method describe in this invention has good built-in advanced process controls.

In another aspect of this invention, the said non-conformal chemical vapor deposition (CVD) film properties and deposition profiles, key to this invention, are dependent on the chemical vapor deposition (CVD) conditions and advanced process controls. Therefore, in order to make proper and effective use of the non-conformal deposited silicon nitride film layer in the self aligned contact (SAC) process, the deposition process must be well characterized and well controlled. Several useful formulas are given and described in detail in the "Description of the Preferred Embodiments" section. These formulas provide helpful information to be used with film profiles to feedback to the chemical vapor deposition (CVD), non-conformal film processing conditions for process optimization. Some of the other considerations for process optimization are: poly to poly line and gate spacing, which is important, as well as, the degree of non-conformally of the silicon nitride film, the design ground rules for poly to poly and source/drain contact space, and process problems such as "bread loafing". Other factors, i.e., the selectivity of the etch between BPSG boro phosphosilicate glass and the silicon nitride layer are also important. For the requirement of contact to poly isolation and to maintain good electrical isolation, the top corner process thickness of the non-conformal, chemical vapor deposition (CVD) silicon nitride is dependent on: (1) chemical vapor deposition (CVD) conditions (2) poly thickness and spacing (3) etch selectivity between BPSG, boro phosphosilicate glass and silicon nitride.

And yet in another application of this invention, the above an other objectives are realized by applying this invention to chip device areas where the poly to poly lines and gate distances are large. The non-conformal, chemical vapor deposition (CVD) silicon nitride process is dependent on the pattern density of the substrate. Thus, this self aligned contact scheme can only be made between two adjacent parallel poly lines, with fixed poly to poly spacing design rules. Furthermore, in the wider poly spacing areas, the silicon nitride thickness on the silicon will be the same as on top of poly and hence, the SAC process is no longer valid. In addition, of another concern are the connections from metal to poly, where there is a concern with the thick silicon nitride layer on top of poly. These two concerns that were raised above can be easily solved by separating the SAC patterning mask from the normal contact masks. Thusly, the normal or standard contact mask can be used for both the poly contacts and diffusion contacts on or in an "open area", large distances or spaces.

And in yet another embodiment of this invention, self aligned contact process to source/drain area, is the enhanced electrical device performance yielded by the application of this invention to CMOS MOSFET's. The electrical performance of the invented SAC process is determined by the effective width of the contact to the source/drain and by some other parameters. The larger the effective contact width to the source/drain, the lower the contact electrical resistance. This invention gives a process that is self aligned, which minimizes design contact area ("zero" design ground rule tolerance, spacing from contact to gate), while maximizing contact area for metal to source/drain, effective contact width.

In summary, the many of the embodiments and features of the present invention for fabricating metal self-aligned contact to the source/drain area were described. However, there are other standard processes and process steps that take place in the fabrication of circuits, and more specifically CMOS MOSFET's, that are not specifically stated, referenced or described herein. However, those who are skilled in the art can provide these elements.

BRIEF DESCRIPTION OF THE DRAWINGS

The object and other advantages of this invention are best described in the preferred embodiments with reference to the attached drawings that include:

FIG. 1, which in cross-sectional representation illustrates the Prior Art or standard method of forming SAC, self aligned contact to source/drain.

FIG. 2, which in cross-sectional representation illustrates the method of one embodiment of the present invention. It shows the non-conformal chemical vapor deposition of silicon nitride after the formation of polysilicon gate structure and gate sidewall spacer.

FIG. 3, which in cross-sectional representation illustrates an SEM micrograph of the method of non-conformal CVD silicon nitride film layer and silicon dioxide film layer over two closely spaced metal test pattern structures. Note the touching of the CVD film near the top corner edges of the test structures. This is a deleterious effect termed "bread loafing".

DESCRIPTION OF THE PREFERRED EMBODIMENTS

Figure 4:
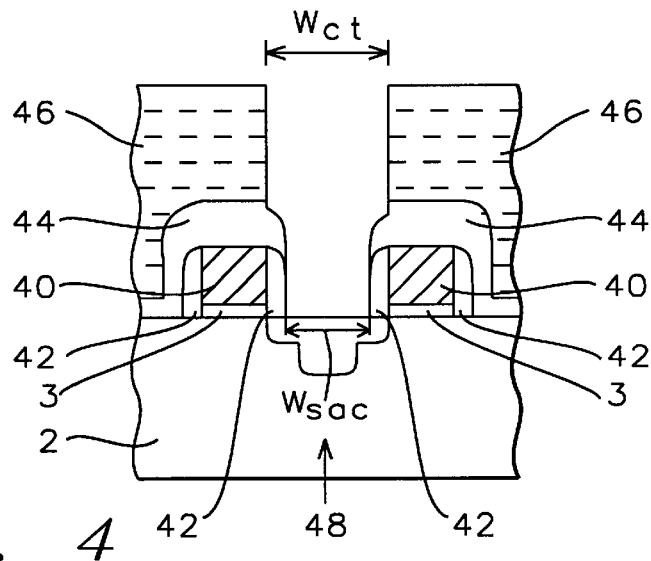
FIG. 4, which in cross-sectional representation illustrates the method of another embodiment of the present invention, wherein the SAC, self aligned contact process is shown between two parallel poly lines.

The new and improved method of fabricating self aligned metal contacts to source/drain area is described below with reference to the attached figures. Reference is first made to conventional Prior Art methods.

Referring to FIG. 1, this sketch illustrates in cross-section, the standard or conventional Prior Art method for fabricating metal self-aligned contact to source/drain area. The substrate 2 is single crystal silicon semiconductor. The source/drain contact region is sketched as 5, over a source/drain 7 ion implantation/diffusion area. The FET gate oxide 3 is an ultra thin layer of silicon dioxide, so thin that it can be difficult to depict in the figures. The gate electrode stack is an insulator capped polycide structure, consisting of gate oxide 3, polysilicon gate 4, and metal silicide 6. The gate insulator-cap material is depicted as 8, and is referred to as the hard mask insulator layer. Gate etch is needed to remove this hard mask insulator layer 8, before etching into polycide structure 10. After a conventional gate sidewall spacer 12 formation process and source/drain ion implantation, another insulator layer 14, typically silicon nitride, is used to serve as the etch-stop layer for the self aligned contact (SAC) etch process if the cap insulator 8 used is oxide. A thick layer 16, composed of BPSG, boro phosphosilicate glass is used. The SAC etch process removes the BPSG and stops either on the etch-stop insulator 8 or on the-gate hard mask layer. Then, a second etch step with different chemistry is utilized, in the case where an etch-stop layer is utilized, to remove the etch-stop layer 14. In this standard SAC process, an additional gate contact mask is needed to open the contacts to the gate electrode, over the polysilicon gate 4.

Referring to FIG. 2, this sketch illustrates in cross-section one of the first embodiments of the present invention for fabricating metal self-aligned contact to the source/drain area. For completeness, the following layers are shown, the substrate 2 is single crystal silicon, gate oxide 3, polysilicon gate 4 with appropriate gate sidewall spacers 12. Key to this invention is the use of a special chemical vapor deposition (CVD) process that produces a non-conformal layer of silicon nitride 20 over the gate 4. This special chemical vapor deposition (CVD) process, fabricating the said non-conformal layer of silicon nitride 20, simplifies the SAC process to source/drain areas by eliminating the need for an etch-stop layer, required for Prior Art conventional processing. As can be clearly seen in FIG. 2, the non-conforming silicon nitride layer is much thicker (A) over the top of the polysilicon gates, than is said nitride at the bottom (B) and in between the polysilicon gates 4.

Referring to FIG. 3, this sketch illustrates in cross-section a sketch of a scanning electron microscope (SEM) micrograph showing the results of special chemical vapor deposition (CVD) conditions both a silicon dioxide layer 30 and a silicon nitride layer 32. These non-conformal layers (data taken from a current manufacturing CMOS production process showing process compatibility) over a metal line test pattern 34 (AlCu alloy), further enhance some of the main elements and embodiments of the present invention. Of course, in this invention with application to the logic salicide process, only the silicon nitride layer is utilized and said nitride layer is deposited on polysilicon gates. In addition, by this method the use of a hard mask layer on top of the gate is eliminated by using the said non-conformal deposition of chemical vapor deposition of silicon nitride and said gate process is exactly the same as "the standard logic process". Note that "bread loafing" of the non-conformal layers appears at the top edge and in between the lines. Furthermore, the chemical vapor. non-conformal deposition processes can produce different thickness between the top and bottom of the dense, closely spaced lines. However, a chemical vapor deposition rate ratio of 3:1, between the top and bottom of poly, is achievable by fine tuning the chemical vapor deposition process. As stated above, sketch of the SEM micrograph shows in FIG. 3, the results of non-conformal deposition processes for chemical vapor deposition of silicon nitride and silicon dioxide in an actually state of-the-art CMOS process. Test results, e.g., indicate that favorable thickness ratios between top and bottom of 3:1 for the chemical vapor deposited (CVD) passivating layer of silicon nitride, and for the chemical vapor deposited (CVD) passivating layer silicon dioxide of 2:1, can be achieved by the process methods of this invention. For completeness, in FIG. 3 is shown, a barrier metal layer of Ti/TiN 36 (desolved during SEM sample preparation) and an anti-reflective coating, ARC 38 of TiN.

The chemical vapor deposition (CVD) process conditions for non-conformal silicon nitride, to achieve a thickness ratio of 3:1 (between top and bottom) are: pressure of about 0.01 to 500 Torr, temperature of about 300 to 700° C., gases $N_2, NH_3, SiH_4$, with gas flow rates from about 0 to 10,000 sccm, deposition rates from about 0 to 50,000 Angstrom/min, thickness range in "open" areas from about 1,000 to 8,000 Angstroms.

For completeness, the following is a brief outline of the process steps utilized to build an FET, showing exactly where in the process sequence the non-conformal silicon nitride step described above, fits in: gate pattern and etch, LDD, spacers, S/D, salicidation, then deposit the non-conformal CVD silicon nitride, deposit CVD BPSG, pattern with the SAC mask, two step etch of the SAC contact, then normal S/D and poly contact pattern and etch, finally, barrier metal and metal one interconnect process.

The key process points to this invention are as follows: no hard mask is needed and the gate process is exactly the same as "standard" logic process. The difference is that between the S/D implant, salicidation and the normal contact process, there is inserted a non-conformal CVD silicon nitride deposition with a SAC pattern and etch process.

Referring to FIG. 4, this sketch illustrates in cross-section, the another aspect of the main embodiments of the present invention for fabricating metal self-aligned contact to the source/drain area. FIG. 4 shows in detail the non-conformal chemical vapor deposition (CVD) silicon nitride 44 profile between two parallel polysilicon lines 40. For completeness, some of the other features are: sidewall spacers 42, a thick layer of BPSG boro phosphosilicate glass 46, silicon source/drain region 48. To open self aligned contacts (SAC) between these two poly lines 40, a twofold etch process is followed. Firstly, the BPSG, boro phosphosilicate glass 46 is removed by etching and the etch step is stopped on chemical vapor deposition (CVD) silicon nitride 44. Secondly, the etch chemistry is changed to remove the remaining silicon nitride on top of the silicon source/drain region by a making use of a time controlled etching process. The key point to note is that the silicon nitride on the top of the poly is much thicker than the nitride on the surface of silicon (source/drain region 48) between two parallel poly lines. Hence, the second etch step, described above, can be well controlled to.remove just the silicon nitride on the bottom, while safely keeping more than sufficient silicon nitride on top of the poly for isolation purposes.

Process details of the two step etch process are as follows, for etch step one, selective etch conditions for etching BPSG, boro phosphosilicate glass and not $Si_3N_4$ are: RIE, reactive ion etch reactor, dry etch, pressure of about 0.01 to 500 Torr, temperature of about 0 to 200° C., etch rate from about 1 to 100 KA/min of BPSG with about 0 to 50 KA/min of $Si_3N_4$, gases of $O_2$, $CHF_3$, $CF_4$ with gas flow rates of from 0 to 10,000 sccm, power from about 0 to 5,000 Watts. Process details for etch step two, etch of $Si_3N_4$, non-selectively: RIE, reactive ion etch reactor, dry etch, pressure of about 0.01 to 500 Torr, temperature of about 0 to 200° C., etch rate of about 0 to 50 KA/min for $Si_3N_4$, gases of $O_2$, $CHF_3$, $CF_4$ with gas flow rates of from 0 to 10,000 sccm, power from about 0 to 5,000 Watts, with no selectivity time controlled from about 1 to 500 sec.

Some process details for BPSG, boro phosphosilicate glass layer are: PECVD, plasma enchanced chemical vapor deposition, reactor Applied 5000, thickness from about 3 to 30 KA, with a thermal anneal step or an RTA, rapid thermal anneal.

Figure 5:
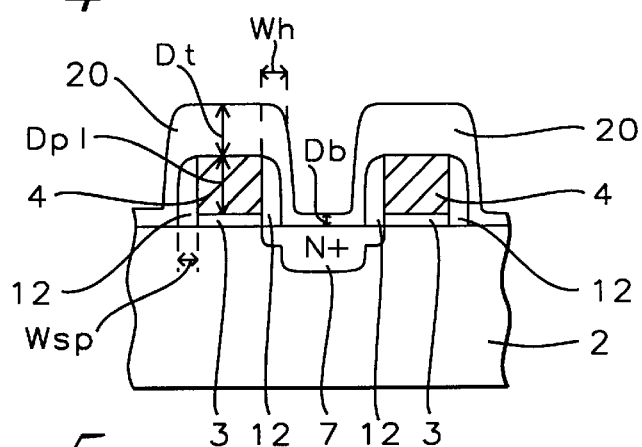
FIG. 5, which in cross-sectional representation illustrates the method or process of the main embodiment of the present invention, wherein the non-conformal silicon nitride layer deposited by chemical vapor deposition (CVD) is shown over two closely spaced poly gate structures with sidewall spacers. Detailed thickness dimensions are shown.

Referring to FIG. 5, this sketch illustrates in cross-section, another one of the embodiments of the present invention for fabricating metal self-aligned contact to the source/drain area. The said non-conformal chemical vapor deposition (CVD) film properties and deposition profiles are key to this invention and are dependent on the chemical vapor deposition (CVD) conditions and advanced process controls. Therefore, in order to use the non-conformal deposited silicon nitride layer in the self aligned contact (SAC) process, the deposition process must be well characterized and controlled. FIG. 5 is a schematic drawing of outlining some of the key process parameters, i.e., the silicon nitride deposition rate ratio between the poly top and bottom, defined as (Dt/Db). The lateral thickness is (Wh) which is measured at the middle of the silicon nitride layer, on top of poly. The requirement for (Wh) is:

$$Wh \leq (Spoly - Wsac)/2 \quad (1)$$

where Spoly is the poly to poly space between SAC

Wsac is the self aligned contact width

Wh is lateral thickness, middle of SiN layer (Note: "Wsp" in FIG. 5 is related to "Wh" above, further described in Equation 5.)

The chemical vapor deposition (CVD) process of the silicon nitride, as well as, the sidewall spacer profile determine the (Wh), the lateral thickness of the nitride film. If (Wh) is too large, having too much nitride on the sidewall, then the nitride layers will merge near the top of the poly gap, causing deleterious "bread loafing" of the CVD layers (shown in FIG. 3).

Referring to FIG. 5, this sketch further illustrates in cross-section, some of the features of the embodiments of the present invention. If the etch selectivity between BPSG, boro phosphosilicate glass and the silicon nitride is expressed as (S), then the top corner silicon nitride thickness requirement for isolation is (T). Therefore, (T) can be expressed as:

$$T = D - (Dpl/S) \quad (2)$$

where D=Dt−Db, difference SiN top−bottom thk

Dpl is poly thickness

Dt is CVD nitride thickness over poly

S is etch selectivity BPSG to SiN

Thus, in order to achieve this process, we must have a deposition process which can meet the following criteria:

$$Dt - Db \geq (Dpl/S) + T \quad (3)$$

where Dpl is poly thickness

S is etch selectivity BPSG to SiN

T is thickness corner requirement SiN

Dt is CVD nitride thickness top over poly

Db is CVD nitride thickness bottom poly

Again referring to FIG. 5, for completeness, the following other device structure features are labeled in FIG. 5, i.e., silicon substrate 2, thin silicon dioxide gate 3, polysilicon gate electrode structure 4, gate sidewalls spacers 12, non-conformal chemical vapor deposited (CVD) silicon nitride 20, and the specified marked distances were define above.

Figure 6:
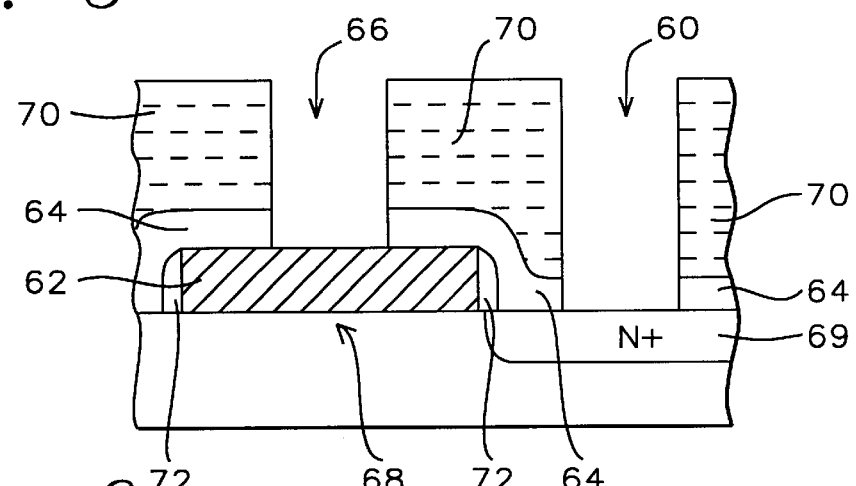
FIG. 6, which in cross-sectional representation illustrates the method of yet another embodiment of the present invention, wherein the SAC, self align contact process uses two patterning masks. This sketch shows normal contact being made to poly and diffusion regions in an "open" active area, with large poly to poly spaces.

Referring to FIG. 6, this sketch illustrates in cross-section, some of the design rule impacts of the present invention on the fabrication of metal self-aligned contact to the source/drain area. The non-conformal, chemical vapor deposition (CVD) silicon nitride process is dependent on the pattern density of the substrate. Thus, this self aligned contact scheme can only be made between two adjacent parallel poly lines, with fixed poly to poly spacing design rules. Furthermore, in the wider poly spacing areas, the silicon nitride thickness on the silicon will be the same as on top of poly and hence, the SAC process is no longer valid. In addition, of another concern are the connections from metal to poly, where there is a concern with the thick silicon nitride layer 64 on top of poly 62. These two issues or concerns that were raised above can be easily solved by separating the SAC patterning mask from the normal contact masks, as shown in FIG. 6. Thusly, the normal or standard contact mask can be used for both the poly contacts 66 and (diffusion 69) diffusion contacts on or in an "open area" 60. The poly "open area" is defined as: the poly to poly space (68) is larger than the contact size (60) plus two times of contact to poly spacing in the design rule, as approximated by the following:

$$Spoly > Wct + 2(Spolyd) \quad (4)$$

where Wct is contact width in design rule

Spolyd is poly to poly contact design

Spoly is poly to poly "open area"

(Note: the thick BPSG, boro phosphosilicate glass is 70, in FIG. 6. and the sidewall spacers are 72, in FIG. 6.)

Finally, the enhanced electrical performance is an embodiment of this invention. The electrical performance of the invented SAC process is determined by the effective contact width (Wsac) and the top corner final, non-conformal chemical vapor deposition (CVD) thickness "T". These terms were also defined in the same earlier.

Wsac can be estimated as:

$$Wsac \sim Spoly - 2(Wsp) \quad (5)$$

where Spoly is poly to poly space between SAC

Wsp is the thickness of the sidewall space

Wsac is the effective contact width to S/D

The above relation is the same as that for the "standard" SAC process.

In summary, the many of the embodiments and features of the present invention for fabricating metal self-aligned contact to the source/drain area were described. For the contact to poly isolation: "T", the top corner process thickness of the non-conformal, chemical vapor deposition (CVD) silicon nitride is dependent on the CVD deposition process, poly thickness and etch selectivity between BPSG, boro phosphosilicate glass and said silicon nitride, as is shown in the formula (2).

While the invention has been particularly shown and described with reference to the preferred embodiments thereof, it will be understood by those skilled in the art that various changes in form and details may be made without departing from the spirit and scope of the invention.

What is claimed is:

1. A method of fabricating self-aligned contacts (SAC) to source/drain of field effect transistors (FET's) on a semiconductor substrate, for closely spaced gates and widely spaced gates, the method comprising:

providing a semiconductor substrate having device areas;

forming a gate oxide on said device areas;

depositing a polysilicon layer on said device areas and elsewhere on the substrate, the polysilicon layer being doped and activated;

providing appropriate patterning, etching, and depositions to form a stacked gate electrode polycide structure, consisting of gate oxide, polysilicon gate and metal silicide;

providing formation of gate insulating sidewall spacers;

forming by ion implantation lightly doped source/drain areas;

providing a salicidation process for source/drains and polysilicon gates;

depositing simultaneously a non-conformal refractory insulating layer over said stacked gate electrode structures that are closely spaced, and, at the same time, a conformal refractory insulating layer over said stacked gate electrode structures, that are widely spaced;

depositing simultaneously a conformal thick layer of refractory insulating layer on said non-conformal insulating layer, and, at the same time, on said conformal insulating layer to planar the entire substrate surface simultaneously;

patterning the widely spaced gates and self-aligned contacts (SAC) with a unique photolithography mask used for this purpose;

opening the widely spaced self-aligned contacts (SAC) to source/drain and gates by a two step etch;

etching in step one the thick conformal insulating layer, while stopping on the conformal insulating layer; etching in step two, using different etch chemistry, the conformal insulating layer over the widely spaced source/drain areas, as well as, removing said insulator over the widely spaced gate stack;

patterning the closely spaced gates and closely spaced self-aligned contacts (SAC) with a special photolithography mask for this purpose;

opening the closely spaced self-aligned contacts (SAC) to source/drain and gates by a two step etch;

etching in step one the thick conformal insulating layer, while stopping on the non-conformal insulating layer;

etching in step two, using different etch chemistry, the non-conformal insulating layer over the closely spaced source/drain areas, while leaving sufficient insulator over the closely spaced gate stack for isolation;

providing patterning and etching to open contact to the polysilicon gate electrodes;

depositing by preferential or selective chemical vapor deposition (CVD) a metal layer, forming metal plugs, in the open silicon areas;

thus self-aligned electrical contacts (SAC) are formed to the source/drain areas and to the gate electrodes thereby completing said field effect transistors.

2. The method of claim 1, wherein said semiconductor substrate is doped single crystal silicon.

3. The method of claim 1, wherein said polysilicon layer is between about 2,000 and 5,000 Angstroms thick.

4. The method of claim 1, wherein said polysilicon layer is conductively doped have a doping concentration of between about $1.0 \text{ E } 19$ and $1.0 \text{ E } 21$ atoms/cm$^3$.

5. The method of claim 1, wherein said non-conformal refractory insulating layer is silicon nitride and is deposited by non-conformal chemical vapor deposition (CVD), using reactant gas mixtures of silane, ammonia and nitrogen.

6. The method of claim 1, wherein said non-conformal refractory insulating layer is between about 1,000 to 8,000 Angstroms thick on the polysilicon gate stacks and between about 100 and 3,000 Angstroms over source/drain areas, for closely spaced gates.

7. The method of claim 1, wherein said conformal thick layer of refractory.insulating layer deposited on the said non-conformal insulating layers is boro phosphosilicate glass (BPSG) having a thickness of between about 3,000 and 30,000 Angstroms.

8. The method of claim 1, wherein said self-aligned contacts (SAC) to source/drains are etched in a two step process, step one being the etch of boro phosphosilicate glass layer with stop on silicon nitride layer, step two being a chemistry change to etch the remaining silicon nitride over the source/drain areas.

9. The method of claim 1, wherein said self-aligned contact (SAC) to source/drains two step etch process removes the said non-conformal refractory insulating layer over the source/drain areas, while leaving sufficient said non-conformal insulating layer over the gate electrodes.

10. A method of fabricating self-aligned contacts (SAC) to source/drain for complementary MOS (CMOS) field effect transistors (FET's) with both P- and N-channel devices on a semiconductor substrate and for standard logic salicided process, using one non-conformal insulating layer for closely spaced gates, the improved method comprising the following steps:

providing a semiconductor single crystal doped substrate having device areas;

forming a gate silicon dioxide on said device areas;

depositing a polysilicon layer on said device areas and elsewhere on the substrate, the polysilicon layer being doped and activated;

providing appropriate patterning, etching, and depositions to form a stacked gate electrode polycide structure, consisting of gate oxide, polysilicon gate and metal silicide;

providing formation of gate insulating sidewall spacers;

forming by ion implantation lightly doped source/drain areas;

providing a salicidation process for source/drains and polysilicon gates;

depositing a non-conformal silicon nitride insulating layer over said stacked gate electrode structures;

depositing a conformal thick layer of boro phosphosilicate glass (BPSG) insulating layer on said non-conformal layers of silicon nitride, to planar the surface;

opening self-aligned contacts (SAC) to source/drain by a two step etch;

etching in step one the thick conformal insulating layer of boro phosphosilicate glass (BPSG), while stopping on the non-conformal silicon nitride insulating layer;

etching in step two, using different etch chemistry, the non-conformal silicon nitride insulating layer over the source/drain areas, while leaving sufficient silicon nitride insulator over the gate stack for isolation;

providing patterning and etching to open contact to the polysilicon gate electrodes;

depositing by preferential or selective chemical vapor deposition (CVD) tungsten metal, forming metal plugs, in the open silicon areas;

thus self-aligned electrical contacts (SAC) are formed to the source/drain areas and to the closely spaced gate electrodes, using one non-conformal insulating layer, thereby completing said field effect transistors, more suitable for standard logic salicided processing.

11. The method of claim 10, wherein said polysilicon layer is between about 2,000 and 5,000 Angstroms thick.

12. The method of claim 10, wherein said polysilicon layer is conductively doped have a doping concentration of between about 1.0 E 19 and 1.0 E 21 atoms/cm$^3$.

13. The method of claim 10, wherein said non-conformal insulating layer silicon nitride is deposited by a special non-conformal chemical vapor deposition (CVD), using reactant gas mixtures of silane, ammonia and nitrogen.

14. The method of claim 10, wherein said non-conformal silicon nitride insulating layer is between about 1,000 and 8,000 Angstroms thick on the polysilicon gate stacks and between about 100 and 3,000 Angstroms over source/drain areas, for closely spaced gates.

15. The method of claim 10, wherein said conformal thick layer of boro phosphosilicate glass (BPSG) deposited on the said non-conformal silicon nitride, the boro phosphosilicate glass (BPSG), is has a thickness of between about 3,000 and 30,000 Angstroms.

16. The method of claim 10, wherein said conformal boro phosphosilicate glass (BPSG) and said non-conformal silicon nitride are etched by a two etch process, wherein the etch selectively of step one to etch boro phosphosilicate glass (BPSG) selectively more than silicon nitride is achieved by RIE, reactive ion etch.

17. A method of fabricating self-aligned contacts (SAC) to source/drain of field effect transistors (FET's) on a semiconductor substrate, for closely spaced gates and widely spaced gates, the improved method comprising the following steps:

providing a semiconductor single crystal doped substrate having device areas;

forming a gate silicon dioxide on said device areas;

depositing a polysilicon layer on said device areas and elsewhere on the substrate, the polysilicon layer being doped and activated;

providing appropriate patterning, etching, and depositions to form a stacked gate electrode polycide structure, consisting of gate oxide, polysilicon gate and metal silicide;

providing formation of gate insulating sidewall spacers;

forming by ion implantation lightly doped source/drain areas;

providing a salicidation process for source/drains and polysilicon gates;

depositing simultaneously a non-conformal silicon nitride insulating layer over said stacked gate electrode structures, that are closely spaced, and conformal silicon nitride over said stacked gate electrode structures, that are widely spaced;

depositing a conformal thick layer of boro phosphosilicate glass (BPSG) insulating layer on said layers of silicon nitride, to planar the surface;

patterning the widely spaced gates and self-aligned contacts (SAC) with a unique photolithography mask used for this purpose;

opening the widely spaced self-aligned contacts (SAC) to source/drain and gates by a two step etch;

etching in step one the thick conformal insulating layer of boro phosphosilicate glass (BPSG), while stopping on the conformal silicon nitride insulating layer;

etching in step two, using different etch chemistry, the conformal silicon nitride insulating layer over the widely spaced source/drain areas, as well as, removing said silicon nitride insulator over the widely spaced gate stack;

patterning the closely spaced gates and closely spaced self-aligned contacts (SAC) with a special photolithography mask for this purpose;

opening the closely spaced self-aligned contacts (SAC) to source/drain and gates by a two step etch;

etching in step one the thick conformal insulating layer of boro phosphosilicate glass (BPSG), while stopping on the non-conformal silicon nitride insulating layer;

etching in step two, using different etch chemistry, the non-conformal silicon nitride insulating layer over the closely spaced source/drain areas, while leaving sufficient silicon nitride insulator over the closely spaced gate stack for isolation;

providing patterning and etching to open contacts to the closely spaced gate electrodes;

depositing by preferential or selective chemical vapor deposition (CVD) tungsten metal, forming metal plugs, in the open silicon areas;

thus self-aligned electrical contacts (SAC) are formed to the source/drain areas and to the gate electrodes, for closely spaced and widely spaced gates, thereby completing said field effect transistors, suitable for standard logic salicided processing.

18. The method of claim 17, wherein said polysilicon layer is between about 2,000 and 5,000 Angstroms thick.

19. The method of claim 17, wherein said polysilicon layer is conductively doped have a doping concentration of between about 1.0 E 19 and 1.0 E 21 atoms/cm$^3$.

20. The method of claim 17, wherein said non-conformal over closely spaced gates is insulating layer silicon nitride is deposited by a special non-conformal chemical vapor deposition (CVD), using reactant gas mixtures of silane, ammonia, and nitrogen.

21. The method of claim 17, wherein said non-conformal silicon nitride insulating layer is between about 1,000 and 8,000 Angstroms thick on the polysilicon closely spaced gate stacks and between about 100 and 3,000 Angstroms over source/drain areas, for closely spaced gates.

22. The method of claim 17, wherein said conformal thick layer of boro phosphosilicate glass (BPSG) deposited on the said silicon nitride, the boro phosphosilicate glass (BPSG) is having a thickness of between about 3,000 and 30,000 Angstroms.

23. The method of claim 17, wherein said conformal boro phosphosilicate glass (BPSG) and silicon nitride are etched by a two sets of etch processes, using two different photo masks, wherein the etch selectively of step one to etch boro phosphosilicate glass (BPSG) selectively more than silicon nitride is achieved by RIE, reactive ion etch.

* * * * *